US011451068B1

(12) United States Patent
Nachman et al.

(10) Patent No.: US 11,451,068 B1
(45) Date of Patent: Sep. 20, 2022

(54) BATTERY-SPECIFIC ADJUSTMENTS TO MAXIMUM BATTERY VOLTAGE

(71) Applicant: Amazon Technologies, Inc., Seattle, WA (US)

(72) Inventors: Ramez Nachman, San Francisco, CA (US); Bryan Holmdahl, San Jose, CA (US); Don Brunnett, Pleasanton, CA (US); Benjamin Thomas Gaide, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 219 days.

(21) Appl. No.: 16/551,170

(22) Filed: Aug. 26, 2019

(51) Int. Cl.
*H02J 7/00* (2006.01)
*G01K 1/14* (2021.01)
(Continued)

(52) U.S. Cl.
CPC ............... *H02J 7/00* (2013.01); *G01K 1/14* (2013.01); *G01R 31/367* (2019.01); *G01R 31/3835* (2019.01)

(58) Field of Classification Search
CPC .. H02J 50/12; H02J 50/80; H02J 50/90; H02J 50/70; H02J 7/025; H02J 50/50; H02J 50/60; H02J 7/0047; H02J 50/005; H02J 5/005; H02J 50/402; H02J 7/0029; H02J 7/00304; H02J 7/35; H02J 7/00034; H02J 7/00045; H02J 7/00309; H02J 7/0044; H02J 2207/20; H02J 2310/48; H02J 50/05; H02J 50/20; H02J 50/502; H02J 50/40; H02J 7/00302; H02J 7/00; H02J 7/0068; H02J 9/061; H02J 2300/00; H02J 2300/22; H02J 3/00; H02J 3/005; H02J 3/007; H02J 3/38; H02J 3/383; H02J 7/007; H02J 7/02; H02J 7/022; H02J 2207/40; H02J 2310/40; H02J 3/322; H02J 50/10; H02J 7/0027; H02J 7/00714; H02J 7/345; H02J 1/00; H02J 1/10; H02J 15/00; H02J 50/00; H02J 50/001; H02J 7/0016; H02J 7/0019; H02J 7/0026; H02J 7/0049; H02J 7/007182;
(Continued)

(56) References Cited

U.S. PATENT DOCUMENTS

2016/0020618 A1* 1/2016 Yang .................... H02J 7/045
320/162
2017/0212170 A1* 7/2017 Torai ................ H01M 10/4285
(Continued)

*Primary Examiner* — Binh C Tat
(74) *Attorney, Agent, or Firm* — Eversheds Sutherland (US) LLP

(57) ABSTRACT

Systems, methods, and computer-readable media are disclosed for battery-specific adjustments to maximum battery voltage. In one embodiment, an example device may include a battery, at least one memory that stores computer-executable instructions, and at least one processor. The device may be configured to determine a first value indicative of a first length of time the battery was at a first voltage and a first temperature, determine a second value indicative of a second length of time the battery was at a second voltage and a second temperature, determine that a sum of the first value and the second value satisfies a first threshold, and cause a maximum output voltage value to be reduced from a first maximum output voltage value to a second maximum output voltage value.

19 Claims, 6 Drawing Sheets

(51) Int. Cl.
*G01R 31/3835* (2019.01)
*G01R 31/367* (2019.01)

(58) Field of Classification Search
CPC .... H02J 7/007184; H02J 7/0078; H02J 7/027; H02J 7/04; H02J 7/045; H02J 7/34; H01F 7/0247; H01F 38/14; H01Q 3/005; H03H 7/40; H02M 7/53871; H02M 1/009
USPC ................................................. 320/149–160
See application file for complete search history.

(56) References Cited

U.S. PATENT DOCUMENTS

| | | | | |
|---|---|---|---|---|
| 2018/0045788 A1* | 2/2018 | Kawai | ................. | G01R 31/367 |
| 2018/0262894 A1* | 9/2018 | Daoura | ................... | H04L 67/02 |
| 2019/0051947 A1* | 2/2019 | Scheucher | ............ | B60L 3/0053 |

* cited by examiner

BATTERY-SPECIFIC ADJUSTMENTS TO MAXIMUM BATTERY VOLTAGE

BACKGROUND

Electronic devices may include batteries or other portable power sources. Certain batteries may be subject to swelling, expanding, or otherwise changing form over time. For example, batteries may swell or otherwise react to thermal events, age, corrosion, damage to components of the batteries, and other factors. Damaged batteries, or batteries that have been used a number of times, may still be charged at charging voltages that do not mitigate any potential adverse effects or further damage to the batteries. In addition, in some instances, one-size-fits-all adjustments to battery charging voltages may be implemented by devices, regardless of whether or not such adjustments are needed at a certain device. Accordingly, battery-specific adjustments to maximum battery voltages may be desired.

Figure 1:
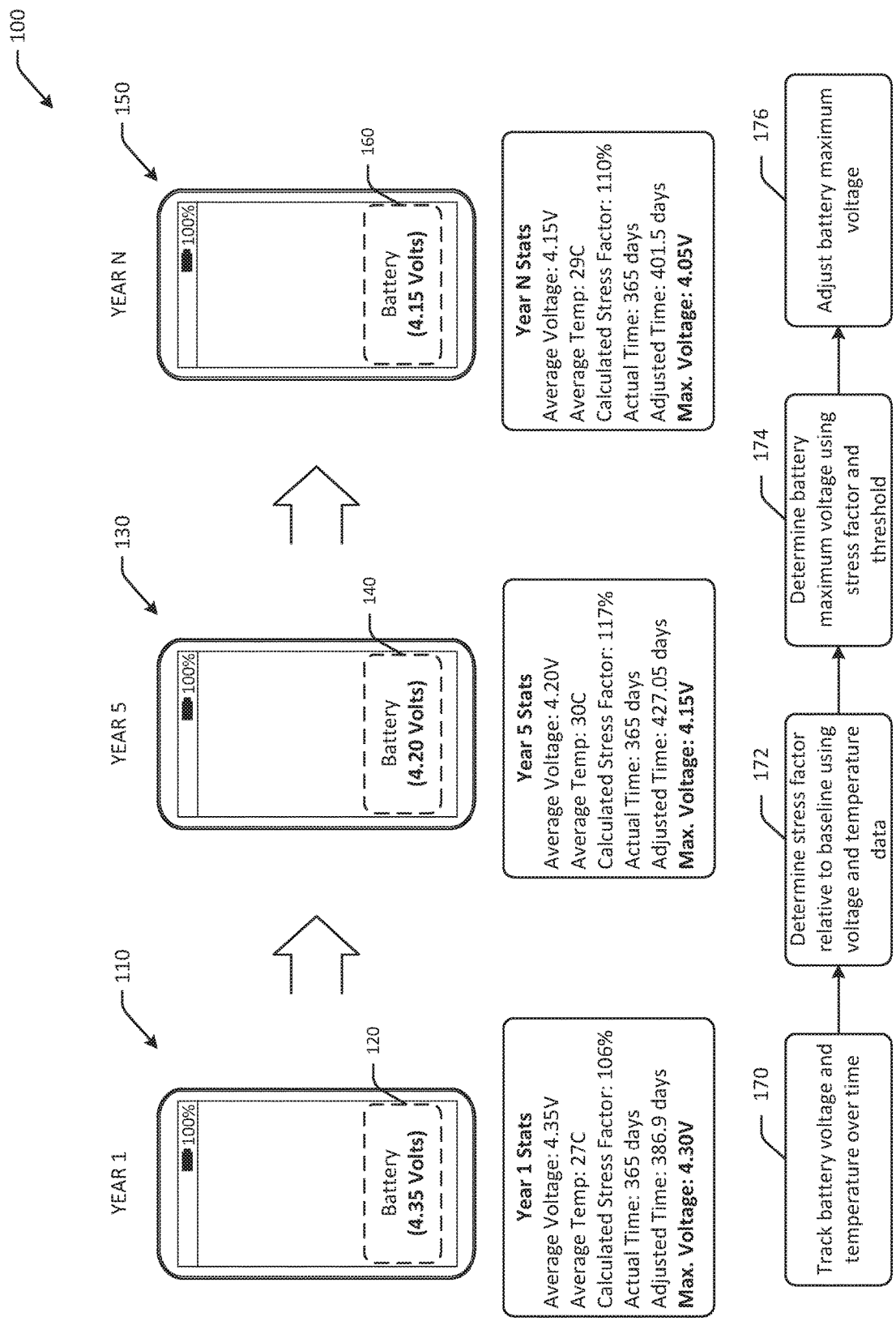
FIG. 1 is an example use case and schematic drawing of battery-specific adjustments to maximum battery voltage over time in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to consume content. Some electronic devices may be portable and may include portable power sources, such as batteries and the like. The batteries or power sources may be rechargeable. Batteries used in electronic devices may have various capacities and/or charging voltages. For example, some batteries may have charging voltages (also referred to as maximum charging voltages) of 4.40 volts, while other batteries may have charging voltages of 9 volts, 3.90 volts, 1.5 volts, and other voltages. Over time, some batteries may deteriorate with respect to capacity. For example, a relatively new battery may have a charging voltage of 4.40 volts, while the same battery after a number of charge cycles (e.g., a charge cycle may be use of a battery's complete capacity, but not necessarily from a full charge to a full discharge, etc.) may retain a charging voltage of 4.35 volts, but may have a lower capacity. The useful life of batteries (e.g., the ability to power an electronic device, etc.) may therefore reduce over time. An example of a charge cycle may be using 40% of a battery's capacity, charging the battery to 100%, and then using 60% of the battery capacity. Although the battery may have been charged in between active usage, only one charge cycle may have been completed. Active usage, or usage, of a battery may include usage of the battery to power device non-essential functionality, such as powering a device display, wireless radios, etc., as opposed to essential functionality, such as internal clocks and other components of a device.

Certain charging voltages may cause thermal events, such as overheating, shocks, hot spots, and the like, or physical damage to batteries. For example, if a battery has a charging voltage of 4.2 volts, and the battery has some corrosion, or there is a power surge, the battery may be damaged. In some instances, damaged batteries may begin to swell or otherwise deform, which may damage a device that the battery is used to power. For example, if a smartphone battery swells, a display of the smartphone may be damaged or cracked, depending on the degree of swelling.

This disclosure relates to, among other things, systems, methods, computer-readable media, techniques, and methodologies for battery-specific management of battery charging settings, such as battery charging voltages and/or battery charging policies. Management and/or configuration of battery charging voltages (e.g., a maximum battery charging voltage, etc.) may mitigate potential damage to batteries and the devices that use the batteries. For example, if a maximum battery charging voltage for a particular battery or a particular type or model of battery is to be reduced, so as to reduce risk of swelling or other damage, the maximum battery charging voltage may be modified in one or more policies or system properties at the device.

In some instances, batteries of a particular type may be used in more than one device and/or by multiple users. In such instances, management and/or configuration of battery charging policies may be implemented at the multiple devices. For example, a maximum battery charging voltage may be automatically reduced after a certain time period for all devices that have the same type of battery. Such automatic reductions may be based on estimated usage of the battery. However, not all of the batteries may have been used in accordance with the estimated usage. Therefore, the automated adjustment may not always be applicable to a certain battery. Embodiments of the disclosure include battery-specific adjustments to maximum batter voltages, where the adjustments are determined for specific batteries based at least in part on the actual battery experience of the battery. The battery experience may include usage, voltages at which the battery is charged to and/or maintained at, temperatures to which the battery is exposed, and/or other factors. As a result, unnecessary adjustments may be avoided (thereby improving a user experience by avoiding reduction to maximum battery voltages as appropriate), and, in some instances, reductions to maximum battery voltages may be accelerated (thereby increasing safety by reducing risk of battery swelling, etc.).

Embodiments of the disclosure include methods and systems that mitigate potential damage to batteries by determining battery-specific adjustments to charging policies and/or capacity of batteries. For example, certain embodiments may modify maximum charging voltages for batteries based at least in part on voltages of the battery over time, temperatures of the battery over time, usages of the battery over time, and/or a combination of these factors and/or other factors. In some instances, actual usage and/or environmental data of a battery may be compared to default or baseline data to determine whether to accelerate and/or decelerate changes to a maximum battery charging voltage. Certain embodiments may reduce swelling and other damage, and may reduce occurrence of thermal events, of batteries. Embodiments may therefore improve user experience and safety with electronic devices by managing battery voltage to avoid swelling and other thermal issues.

Referring to FIG. 1, an example environment 100 with a mobile device with battery-specific adjustments to maximum battery voltage over time is illustrated in accordance with one or more embodiments of the disclosure. The mobile device may be any suitable portable device, such as a smartphone, an e-reader, a tablet, an audio or video streaming device, an Internet of Things (IoT) device, a product ordering button or device, a home sensor, an aging in place device, an earphone, a speaker device, or another device. In the example of FIG. 1, the device may be a smartphone with a battery 120. The battery 120 may be a rechargeable battery, and may be any suitable type of battery, such as a lithium-ion pouch battery, and the like. The battery 120 may power the device.

At a first instance in time 110, such as a first year (e.g., Year 1) after a timestamp, the battery 120 may have a capacity or maximum charging voltage of 4.35 volts. The timestamp may be, for example, a time at which a charging cycle was completed on the device, a time at which a software update was received by or initiated at the device, a time when an update started executing on the device, a time when the update finished executing, or another time. The first instance in time may be after a length of time has elapsed or passed since a trigger event occurred. In one example, a trigger event may be completion of a charging cycle seven days or another time interval earlier. In other embodiments, the length of time may be the length of time since the last change to the charging voltage for the battery, the length of time since a software update was installed, the length of time since a certain number of battery charge cycles were completed, or another trigger event. At the first instance in time 110, the maximum charging voltage for the battery 120 may be set to 4.35 volts. The maximum charging voltage may be controlled by a charging circuit at the device, such as a power management integrated circuit, which may limit the charge of the battery 120 to 4.35 volts. The device may include a battery indicator that indicates the battery is fully charged, or 100% charged, when the battery 120 is charged at 4.35 volts.

Over time, the charging voltage of the battery 120 may be modified until a default battery charging voltage is reached. For example, in FIG. 1, a default battery charging voltage may be 4.20 volts at a second instance in time 130, such as at Year 5. The default battery charging voltage may be a predetermined de-rating or reduction of maximum battery charging voltage over time. For example, a device manufacturer or battery manufacturer may set maximum battery charging voltages that gradually decrease over time to reduce a likelihood of swelling or other battery damage over the lifespan of the battery. Such adjustments may be a one-size-fits-all approach to management of the battery and may not be applicable to individual batteries and/or devices.

However, the battery of the device may have been subject to conditions that were "worse" or otherwise different than those used to determine what the default battery charging voltage should be. For example, as illustrated in FIG. 1, battery statistics for the battery 120 of the device may be determined and used to calculate or determine maximum charging voltage adjustments for the battery 120. The battery statistics may be for a particular time interval, such as the elapsed time since the last charging cycle was completed, a number of hours, days, weeks, years, or another time interval. During the Year 1 time interval, the average voltage of the battery 120 may be determined to be 4.35 volts. The average voltage may be determined based at least in part on the actual voltage of the battery 120 measured at certain times or during intervals and divided over the time interval. The average voltage may be a normal average or a weighted exponential average. The average voltage may represent the average amount of capacity of the battery 120. The average temperature of the battery 120 may be determined over the time interval as well. The average temperature of the battery 120 may represent the average temperature the battery 120 experienced during the time interval. The average temperature may be a normal average or a weighted exponential average. The battery temperature may be the battery skin temperature, the device temperature, the battery pack temperature, and/or a combination thereof. The battery temperature may be determined and/or recorded at certain intervals, added, and divided by the time interval to find the average temperature. The average temperature of the battery may be determined to be 27 degrees Celsius.

The respective average voltage and the average temperature may be compared to baseline or default voltage and temperature values, where the default voltage and temperature values were used to determine a standard de-rating or reduction in maximum battery charging voltage. The comparison may be used to determine whether the reduction in maximum battery charging voltage for the battery 120 should be accelerated or decelerated, or if the battery 120 has been subject to substantially the same conditions as those used for the baseline reduction calculation. For example, the default voltage value may be 4.35 volts and the default temperature may be 25 degrees Celsius. In the example of FIG. 1, the average voltage may be 4.35 volts, which may be the default value, and the average temperature may be 27 degrees Celsius, which may be greater than the default value.

The comparison between the average voltage and temperature values and the default voltage and temperature values may be used to generate or calculate a stress factor. The stress factor may represent a difference between an experience of the battery (e.g., the voltages and temperature the battery has been subjected to, etc.) relative to that of the default or baseline expected usage. For example, due to the higher temperature exposure, the stress factor for the battery 120 after the first time interval at the first instance 110 may be 106%. Stress factors may be represented as percentages, factors, numerical values, points, colors, alphabetical characters, a combination thereof, and/or other suitable indicators.

The stress factor may be used to determine an adjusted time that has elapsed in terms of the total battery lifespan.

For example, although the actual time of the time interval may have been one year, or 365 days, the adjusted time may be determined by determining a product of the stress factor and the actual time, for a total of 386.9 days. The 386.9 days may represent the days of "usage" of the battery 120 had the battery been subject to normal or default conditions. The adjusted time may be added to the historical adjusted time values of the battery 120 to determine an appropriate maximum battery charging voltage. For example, the device or a remote server may determine that the maximum battery charging voltage for the battery 120 is 4.30 volts based at least in part on the sum of the historical adjusted time values for the battery 120.

At the second instance in time 130 (e.g., Year 5), the maximum battery charging voltage of the battery 120 may be set to 4.20 volts. The modified battery 140 may therefore have a maximum battery charging voltage of 4.20 volts. The maximum battery charging voltage may be modified according to battery voltage setting data or a battery charging policy, which may include a look-up table or other structured or unstructured data, that is received from one or more remote servers and/or locally stored. The second instance in time may be four weeks after the first instance 110, or any other time interval. Although the maximum battery voltage was reduced from 4.35 volts in Year 1 to 4.20 volts in Year 5, the battery indicator at the device may continue to present a fully charged or 100% charged indication, as illustrated in FIG. 1. For example, the device may determine that the battery 140 is charged to the voltage value of 4.20 volts, and the device may present an indication that the battery 140 is fully charged. In some embodiments, rather than immediately changing the battery charging voltage from 4.35 volts to 4.20 volts, the battery charging voltage may be gradually changed in steps or increments over time. As a result, a user of the device may not immediately be impacted by a rapid or sudden change in battery charging capacity (e.g., suddenly reduced battery life, etc.).

Battery statistics for Year 5 may indicate that the average voltage of the battery 120 during a time interval was 4.20 volts, and the average temperature of the battery may have been determined to be 30 degrees Celsius. The respective average voltage and the average temperature may be compared to the baseline or default voltage and temperature values, where the default voltage and temperature values were used to determine a standard de-rating or reduction in maximum battery charging voltage. The average voltage of 4.20 volts may be less than the default value of 4.35 volts, and the average temperature of 30 degrees Celsius may be greater than the default value of 25 degrees Celsius. The comparison between the average voltage and temperature values and the default voltage and temperature values may be used to generate or calculate a stress factor. The stress factor for the battery 120 after the second time interval at the second instance 130 may be determined to be 117%. The adjusted time for the time interval may be determined to be 427.05 days based at least in part on the stress factor. The adjusted time may be added to the historical adjusted time values of the battery 120 to determine an appropriate maximum battery charging voltage. For example, the device or a remote server may determine that the maximum battery charging voltage for the battery 120 is 4.15 volts based at least in part on the sum of the historical adjusted time values for the battery 120.

At a third instance in time 150, the maximum battery charging voltage may be set at the battery 160 to 4.15 volts. The third instance in time 150 may be, for example, a certain amount of time after a trigger event (e.g., Year N). Although the battery 160 has a charging voltage that is 0.2 volts less than at Year 1, the battery indicator at the device may still present a fully charged or 100% charged indication when the battery 160 is charged at 4.15 volts. The battery 160 may be prevented from exceeding 4.15 volts for safety.

Although the maximum battery charging voltage in the example of FIG. 1 was reduced from 4.35 volts to 4.15 volts, a user of the device may not be negatively impacted or perceive the change due to the incremental reduction over time. At the same time, potential benefits of reducing the maximum battery charging voltage may still be gained.

Battery statistics for Year N may indicate that the average voltage of the battery 120 during a time interval was 4.15 volts, and the average temperature of the battery may have been determined to be 29 degrees Celsius. The respective average voltage and the average temperature may be compared to the baseline or default voltage and temperature values, where the default voltage and temperature values were used to determine a standard de-rating or reduction in maximum battery charging voltage. The average voltage of 4.15 volts may be less than the default value of 4.35 volts, and the average temperature of 29 degrees Celsius may be greater than the default value of 25 degrees Celsius. The comparison between the average voltage and temperature values and the default voltage and temperature values may be used to generate or calculate a stress factor. The stress factor for the battery 120 after the third time interval at the third instance 150 may be determined to be 110%. The adjusted time for the time interval may be determined to be 401.5 days based at least in part on the stress factor. The adjusted time may be added to the historical adjusted time values of the battery 120 to determine an appropriate maximum battery charging voltage. For example, the device or a remote server may determine that the maximum battery charging voltage for the battery 120 is 4.05 volts based at least in part on the sum of the historical adjusted time values for the battery 120.

As a result, the specific conditions to which the battery 120 may be used to determine proper battery de-rating and/or adjustments to maximum charging voltages. A risk of damage to batteries due to usage that exceeds the conditions for which baseline or default values was determined may be reduced, and, for batteries that experience conditions better than baseline or default values, premature degradation of battery performance may be avoided.

High battery temperatures and voltages can accelerate gas generation in batteries, which can lead to swelling and other issues. Embodiments of the disclosure can manage maximum battery voltages for certain devices and/or batteries based on particular usage conditions in or near real-time or after time intervals. Time intervals may be seconds, minutes, days, weeks, based on charging events, or other intervals. In an example embodiment, an amount of time the battery spends at a particular voltage and temperature is recorded and accumulated to determine a stress factor or acceleration value. When the cumulative time approaches a swelling risk threshold, a suitable voltage de-rating can be applied to keep the battery safely operational for the rest of the device life.

An example process flow is illustrated in FIG. 1. At a first operation 170, a device may track battery voltage and temperature over time. For example, the device may periodically or at certain time intervals determine a battery voltage and a battery temperature. The voltage and temperature data may be recorded at the device or sent to one or more remote servers. By default, the device may operate with a default battery maximum voltage. In one embodiment, firmware of the device may be used to counts hours or time at certain voltages and/or temperatures during actual usage. In some embodiments, the time the device or battery spends at every voltage and temperature may be recorded. Data comes in records of elapsed time but the cumulative time may include (i) time device spent in each of the charging states (charge, discharge, idle) registering voltages and temperatures to be send to the cloud or to memory for later to be send to the cloud; (ii) periods of time when device is off or in sleep mode in between usages, and there is no metrics flow; (iii) long term storage time, and/or other data.

At a second operation 172, the device and/or a remote server may determine a stress factor for the battery relative to a baseline using the voltage and temperature data. A stress factor may be a battery environment value that is indicative of a difference between an environment of the battery and the baseline ambient environment of the battery. In one example, the stress factor may be a value used to determine an adjusted time value. For instance, an adjusted time value may be equivalent to an amount of time if the battery had been subject to baseline conditions. In an example, a baseline temperature may be 25 degrees Celsius and a baseline voltage may be 4.35 volts, and the adjusted time may equal (Real Time/($A_{4.35V}*A_{25C}$), where A is the stress factor.

At a third operation 174, the device and/or a remote server may determine a battery maximum voltage using the stress factor and a threshold. For example, a lookup table or database with elapsed time values and corresponding maximum voltages may be stored or accessed by the device. The database may indicate maximum output voltage values after different threshold amounts of time have elapsed. For example, a first threshold may be one year, a second threshold may be eighteen months, a third threshold may be two years, and so forth. Depending on the conditions of the battery, the threshold amounts of time may be met sooner than an actual amount of time elapses (e.g., the threshold of one year could be met in eleven months depending on battery conditions, etc.).

At a fourth operation 176, the device may adjust the maximum battery charging voltage. For example, based at least in part on the database value, the device may cause the power management integrated circuit to set a maximum battery charging voltage accordingly. In some embodiments, the device may generate a notification indicating to users that the maximum battery charging voltage has been reduced, to exchange the device or battery for a new one for free, to modify user behavior, and/or for another purpose.

As a result, battery capacity and/or maximum battery charging voltages used to charge batteries may be increased or decreased while minimizing impact on a user experience. By managing and/or configuring the maximum battery charging policies, thermal events and/or swelling or other undesired occurrences may be reduced or avoided.

Accordingly, embodiments of the disclosure may improve safety, and may reduce gaseous swelling of batteries. Some embodiments may reduce or eliminate the need for blanket battery de-rating. Some embodiments may extend the battery swelling lifetime safely beyond five years. Embodiments may be applicable to various battery or device manufacturers, battery chemistries, and so forth.

Example embodiments of the disclosure provide a number of technical features or technical effects. For example, in accordance with example embodiments of the disclosure, certain embodiments of the disclosure may include batteries that with charging voltages configured based on battery condition data locally and/or by one or more remote servers. Some embodiments may include devices configured to determine device usage metrics, battery usage metrics, lengths of elapsed time, and other metrics. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
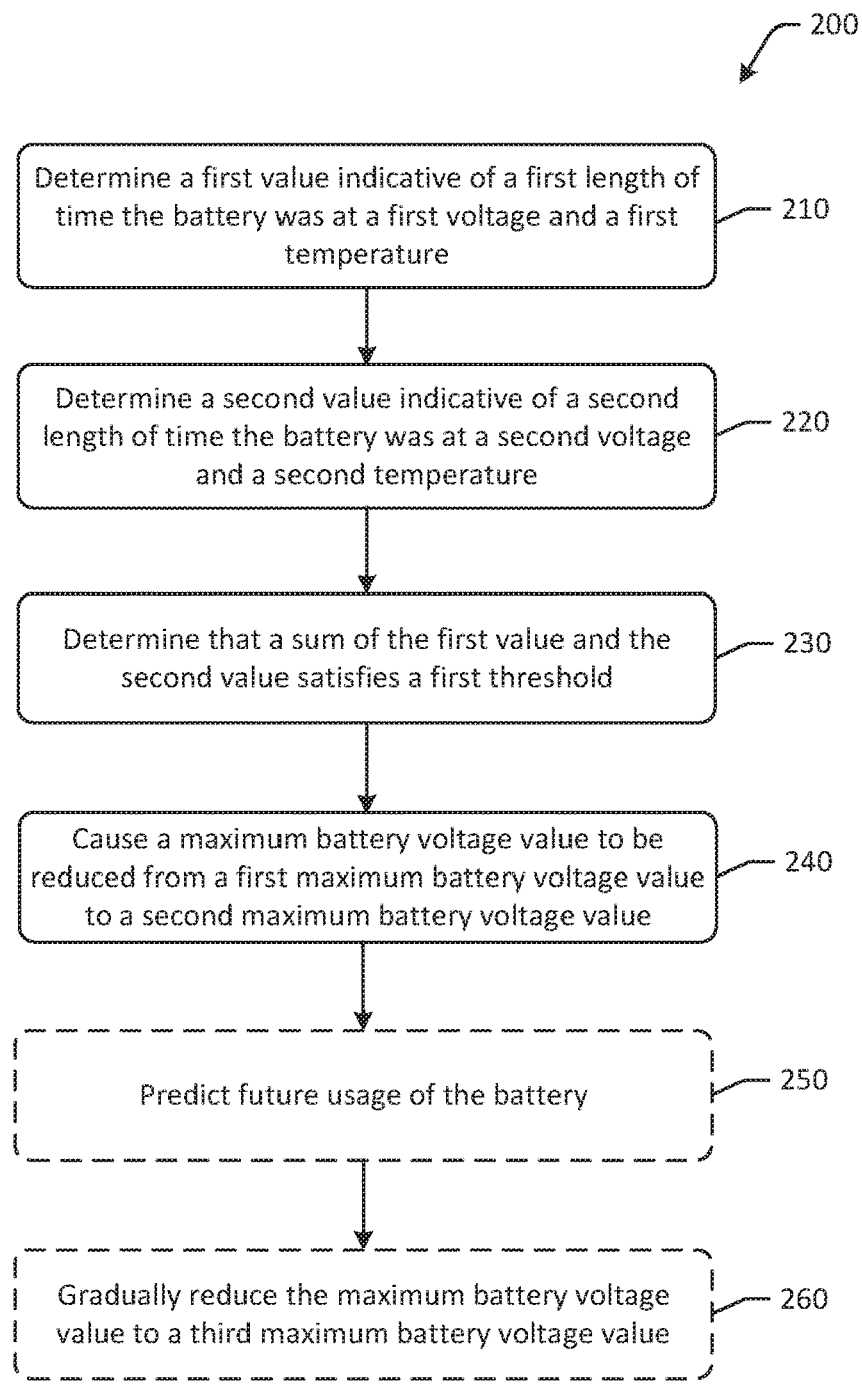
FIG. 2 is an example process flow for battery-specific adjustments to maximum battery voltage in accordance with one or more embodiments of the disclosure.

FIG. 2 is an example process flow 200 for battery-specific adjustments to maximum battery voltage in accordance with one or more embodiments of the disclosure. One or more of the operations of FIG. 2 may be performed at a client device and/or remote server in some embodiments. One or more of the operations of the process flow 200 may be optional and may be performed in any order or at least partially concurrently in some embodiments.

At block 210 of the process flow 200, a first value indicative of a first length of time a battery was at a first voltage and a first temperature may be determined. For example, one or more computer processors may execute one or more modules having computer-executable instructions to determine a first value indicative of a first length of time a battery was at a first voltage and a first temperature. The battery may be at the same device as the one or more computer processors or may be at a different device (e.g., a remote server may perform one or more determinations, etc.). The first length of time the battery was at a first voltage and the first temperature may be determined by a device by monitoring battery voltage and temperature over time. For example, the battery voltage may be measured at 4.35 volts and the battery temperature may be measured at 24 degrees Celsius for a first length of time, such as 4 minutes, and a first length of time indicative of how long the battery was at that voltage and temperature may be determined. In some instances, ranges may be used instead of particular values. For example, the first length of time may represent a time during which battery voltage was between two values, and the temperature was between two values. The battery voltage may be the voltage of the battery. The battery temperature may be one or more of a battery pack temperature, a battery skin temperature, a device temperature, and/or a combination thereof.

The first length of time may be converted to a first value. For example, the first value may be determined using the first length of time, the first voltage, and/or the first temperature. In some embodiments, the first value may be a stress factor applicable to the first time interval, whereas in other embodiments, the first value may also be a length of time that is a scaled version of the first length of time.

In some embodiments, average voltage values and/or temperature values may be determined over a time interval, instead of, or in addition to, individual voltage values or temperature values determining periodically. For example, the device may determine an average voltage of the battery (e.g., first average battery output voltage, etc.) during a time interval, where the first voltage is the average voltage. The device may determine an average temperature (e.g., first average battery temperature of the battery, etc.) during the time interval, where the first temperature is the average temperature.

In some embodiments, the determined voltage and temperature values, or average voltage and temperature values, may be compared to baseline values that were used to calculate standard maximum charging voltage reduction. For example, a baseline battery temperature may be associated with a baseline ambient environment of the battery, and may have been used to calculate or determine a battery de-rating schedule. The device may determine whether the measured battery temperature is greater than, less than, or equal to the baseline battery temperature. The baseline ambient environment may be associated with a baseline battery voltage indicative of a battery voltage used to calculate or determine the battery de-rating schedule. The device may determine whether the measured battery voltage is greater than, less than, or equal to the baseline battery voltage. To determine the first value, the device may determine, based at least in part on (i) a difference between the battery temperature and the baseline battery temperature, and (ii) a difference between the battery voltage and the baseline battery voltage, a battery environment value for the battery during the first time interval, where the battery environment value is indicative of a difference between an environment of the battery and the baseline ambient environment of the battery. The first value may reflect a magnitude or scale difference between actual battery environment and expected or baseline battery environment.

In some embodiments, time intervals may be event triggered. An example event trigger may be a charging event. For example, the device may determine that a charger state of the device has changed from a first state to a second state, such as from connected to disconnected. The first length of time and the second length of time may have occurred while the charger state was the first state. The charger state may be indicative of whether or not the device is connected to a charger or is otherwise charging. For example, when the device is connected to a charger that is connected to a power source, such as a wall outlet, the charger state may indicate charging, and when the charger or power source is disconnected, the charger state may indicate not charging. A change in charging state may trigger a calculation of stress factor over a previous time interval.

An example equation to determine a stress factor (also referred to as battery environment value or acceleration factor) is, for temperature, $AT = e - E(1273 + T2)e - EaK(1273 + T1)$, and, for voltage, $AV = e - VaV2e - VaV1$, where Ea and Va are empirically obtained. Adjusted time values may be determined using an equation such as: equivalent time at baseline values of voltage and temperature=Real Time/$(A_{4.35V}*A_{25C})$.

At block 220 of the process flow 200, a second value indicative of a second length of time the battery was at a second voltage and a second temperature may be determined. For example, one or more computer processors may execute one or more modules having computer-executable instructions to determine a second value indicative of a second length of time the battery was at a second voltage and a second temperature. The second length of time may be during a second time interval. For example, the battery may have been at a voltage of 4.0 volts and 22 degrees Celsius for a second length of time, such as 3 minutes. The second value may be determined based at least in part on the second length of time, the second voltage, and/or the second temperature.

The second length of time may be converted to a second value. For example, the second value may be determined using the second length of time, the second voltage, and/or the second temperature. In some embodiments, the second value may be a stress factor applicable to the second time interval, whereas in other embodiments, the second value may also be a length of time that is a scaled version of the second length of time. To determine the second value, the device may determine, based at least in part on (i) a difference between the battery temperature and the baseline battery temperature, and (ii) a difference between the battery voltage and the baseline battery voltage, a battery environment value for the battery during the second time interval, where the battery environment value is indicative of a difference between an environment of the battery and the baseline ambient environment of the battery. The second value may reflect a magnitude or scale difference between actual battery environment and expected or baseline battery environment.

At block 230 of the process flow 200, determine that a sum of the first value and the second value satisfies a first threshold. For example, one or more computer processors may execute one or more modules having computer-executable instructions to determine that a sum of the first value and the second value satisfies a first threshold. In some instances, the first value and the second value may be lengths of time, such that the sum is a length of time. The summed length of time may be used as the "actual" length of time the battery has been in service, such as a lifetime usage of the battery. In other instances, the first value and the second value may be points or other alphanumeric values. The first threshold may be a length of time the battery has been in use after which a scheduled reduction in maximum battery voltage is to be implemented. For example, the first threshold may be 6 months, one year, or another time interval. In other examples, the first threshold may be a percentage, such as 10% usage, a fraction, such as $\frac{1}{10}$, or any other suitable threshold representing consumption of the battery lifespan.

In an example embodiment, the device may determine, using the first battery environment value (or stress factor) and a length of the first time interval, a battery consumption value indicative of a lifespan of the battery consumed during the first time interval. The device may determine, using the second battery environment value (or stress factor) and a length of the second time interval, a battery consumption value indicative of a lifespan of the battery consumed during the second time interval. The device may determine that a sum of the battery consumption values of the battery (in addition to historical consumption values for the device, if any) is greater than a default consumption value for a lifetime of the battery, where the default consumption value may be a real length of time, or actual elapsed time, the battery has been in use.

At block 240 of the process flow 200, a maximum output voltage value may be caused to be reduced from about a first maximum output voltage value to about a second maximum output voltage value. For example, one or more computer processors may execute one or more modules having computer-executable instructions to cause a maximum output voltage value to be reduced from about a first maximum output voltage value to about a second maximum output voltage value. The second maximum output voltage value may be determined using a lookup table, a database, received from a remote server, or otherwise determined by the device. An example lookup table is discussed with respect to FIG. 4. In some embodiments, the second maximum output voltage value may be determined using the first threshold. For example, if the first threshold is an elapsed time of 24 months, the second maximum output voltage value may be stored in association with the elapsed time of 24 months and may therefore be determined using the 24 month value. In another example, the device may determine, using the sum of the battery consumption values and any historical consumption values, a second maximum allowed charging voltage that is less than the first maximum allowed voltage, and may cause a maximum allowed voltage of the battery to be reduced from the first maximum allowed voltage to about the second maximum allowed voltage.

The battery environment value may be a stress factor value, the battery consumption value may be a product of the battery environment value and the length of the first time interval, and the default consumption value may be a real time value (e.g., actual elapsed time).

At optional block 250 of the process flow 200, future usage of the battery may be predicted. For example, one or more computer processors may execute one or more modules having computer-executable instructions to predict future usage of the battery. Based at least in part on the historical usage of the battery, the device may determine an estimated future usage or future environmental conditions relative to the baseline environment values.

At optional block 260 of the process flow 200, the maximum output voltage value may be gradually reduced to a third maximum output voltage value. For example, one or more computer processors may execute one or more modules having computer-executable instructions to cause the maximum output voltage value to be gradually reduced over a number of days (e.g., in increments, etc.) to a third maximum output voltage value. As a result, a subsequent battery voltage reduction may be less noticeable to a user.

Figure 3:
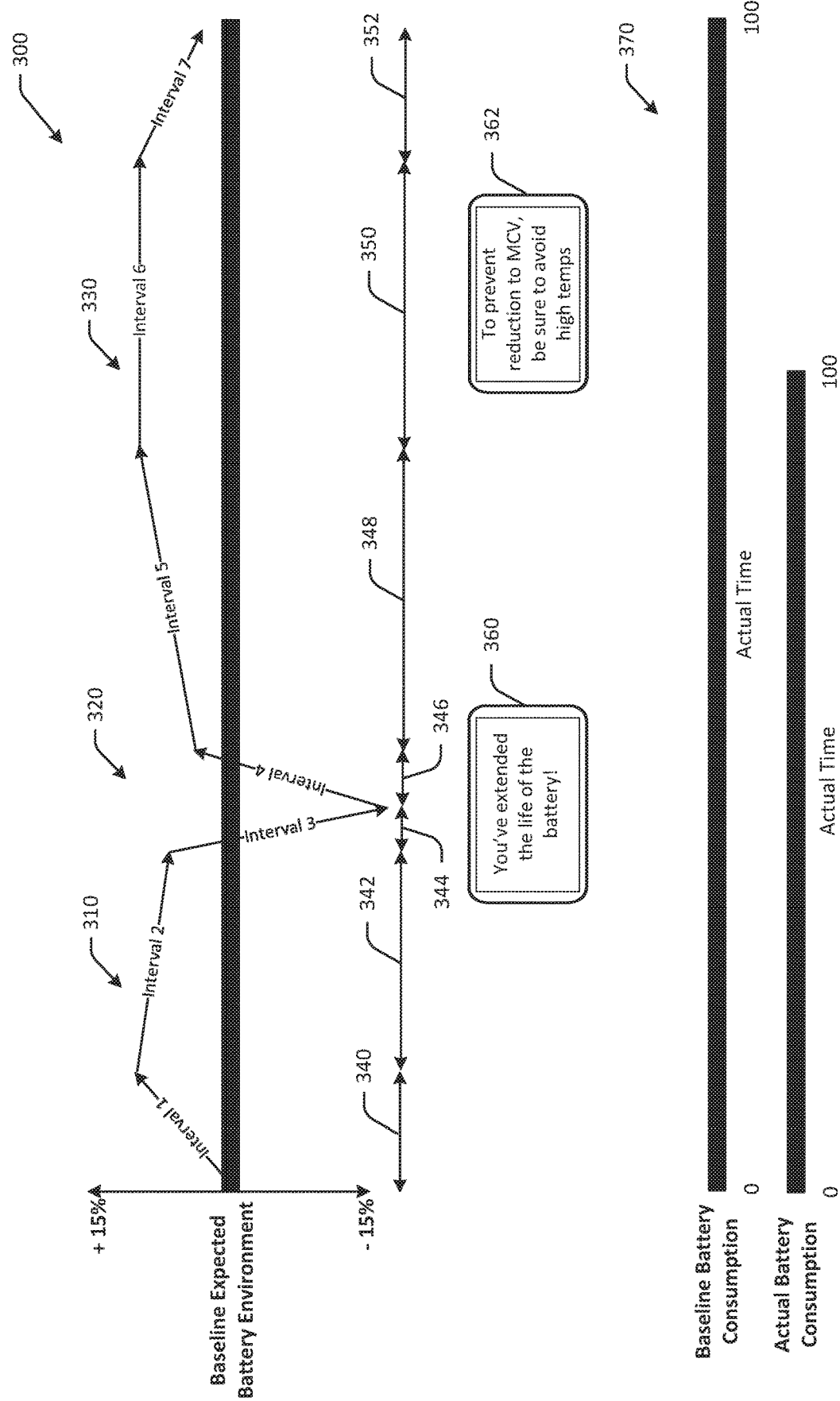
FIG. 3 is a schematic drawing of example battery environment data and battery consumption data over time in accordance with one or more embodiments of the disclosure.

FIG. 3 is a schematic drawing of example battery environment data 300 and battery consumption data over time 370 in accordance with one or more embodiments of the disclosure. The illustrations of FIG. 3 are for illustrative purposes only and are provided only as an example implementation.

In FIG. 3, the example battery environment data 300 illustrates baseline ambient battery environment as a straight line over time. The baseline ambient battery environment may be the values used to determine a default battery maximum charging voltage reduction over time. However, the illustrated data 300 illustrates that actual usage of the battery, or the actual battery environment, is different than the baseline ambient battery environment. For example, different vectors for different time intervals (which may be the same length of time or different lengths of time) are depicted. The vectors may incorporate battery temperatures and battery voltages during the interval, and the length of the vector may represent the amount of time in the time interval. For example, a first interval may be for a first length of time 340, a second interval may be for a second length of time 342, a third interval may be for a third length of time 344, a fourth interval may be for a fourth length of time 346, a fifth interval may be for a fifth length of time 348, a sixth interval may be for a sixth length of time 350, and a seventh interval may be for a seventh length of time 352. The respective lengths of time may be used to determine an impact of the battery environment experienced during the time interval to the overall acceleration or stress factor of the battery.

During the first and second time intervals 310, the battery may have had a more strenuous experience than the baseline ambient battery environment. For example, one or both of the battery temperature and battery voltage may have been higher than the baseline values. During the third and fourth time intervals 320, the battery may have had a less strenuous experience than the baseline ambient battery environment. For example, one or both of the battery temperature and battery voltage may have been less than the baseline values. For example, the user may not have used the device, the user may not have kept the device in sunlight, the user may not have left the device on a charger, and/or the like. During the fifth, sixth, and seventh intervals 330, the battery may have had a more strenuous experience than the baseline ambient battery environment. For example, one or both of the battery temperature and battery voltage may have been higher than the baseline values.

Because the actual battery environment is worse, or more strenuous, than the baseline ambient battery environment, battery voltage de-rating may be accelerated. For example, as illustrated in the battery consumption data over time 370, baseline battery consumption may be an actual time of X years, and the actual battery consumption is less than X years. For example, the battery will actually be fully consumed before the baseline battery consumption anticipates, due to the particular usage and/or environment of the battery.

In some embodiments, using the data 300, the device may tailor battery voltage reductions to preemptively decrease battery voltages based at least in part on historical or present usage. For example, the device may determine an expected sum of stress factors for upcoming time intervals, and may determine that the sum is greater than the expected sum and less than a second threshold. The device may cause the maximum output voltage value to be reduced from about the second maximum output voltage value to about a third maximum output voltage value over a period of time. In another example, the device may determine, based at least in part on the first value and the first length of time, an estimated value indicative of a third length of time the battery will be at the first voltage and the first temperature, and may determine that a sum of the first value, the second value, and the estimated value satisfies a second threshold. The device may generate a first notification 362 indicating that the maximum output voltage value will be reduced, and/or with a recommendation for actions that the user can take to prevent a reduction. For example, the first notification 362 may indicate that the maximum charging voltage reduction can be prevented by avoiding high device temperatures. In a second notification 360, the notification may indicate to a user that the life of the battery has been extended as a result of recent usage or environmental data (e.g., the third and fourth time intervals 320). For example, the device may determine that an actual value is less than the estimated value, and may cause the maximum output voltage value to be increased from the third maximum output voltage value to the second maximum output voltage value (up to a maximum allowable battery voltage value of the battery). Other notifications may include user instructions, such as instructions to replace a device or battery, recommendations to delay reduction of the maximum allowed voltage to the third maximum allowed voltage, and so forth. Users may opt-in or opt-out of any notifications.

For predictions, different time intervals and/or battery environment data may be weighted differently. For example, the device may determine a first weight for the first value based at least in part on an elapsed time since the first length of time, and may determine a second weight for the second value based at least in part on an elapsed time since the second length of time. To determine that the sum of the first value and the second value satisfies the first threshold, the device may determine that a sum of a weighted first value and a weighted second value satisfies the first threshold.

Figure 4:
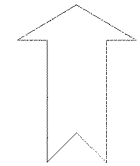
FIG. 4 is a schematic drawing of an example default battery maximum voltage table and an example battery-specific adjustment to maximum battery voltage in accordance with one or more embodiments of the disclosure.

FIG. 4 is a schematic drawing of an example default battery maximum voltage table 410 and an example battery-specific adjustment to maximum battery voltage 420 in accordance with one or more embodiments of the disclosure. Other embodiments may include additional, fewer, or different values or determinations, and may be in different formats, such as a database format, query format, or other structured or unstructured data format.

The default battery maximum voltage table 410 may be a voltage table generated by a device or battery manufacturer or other entity using default or baseline ambient environmental conditions. The default battery maximum voltage table 410 may include thresholds, such as time thresholds, associated with corresponding maximum battery voltages. The maximum battery voltages may decline with time. For example, the default battery maximum voltage table 410 may include a maximum charging voltage (MCV) for baseline consumption of 4.35 volts after the battery has been in use for 6 months. That is, after 6 months of actual elapsed time at baseline consumption, the maximum charging voltage may be set to 4.35 volts. After 12 months of actual elapsed time at baseline consumption, the maximum charging voltage may be set to 4.31 volts. After 18 months of actual elapsed time at baseline consumption, the maximum charging voltage may be set to 4.28 volts. After 24 months of actual elapsed time at baseline consumption, the maximum charging voltage may be set to 4.22 volts. After 30 months of actual elapsed time at baseline consumption, the maximum charging voltage may be set to 4.19 volts. After 36 months of actual elapsed time at baseline consumption, the maximum charging voltage may be set to 4.17 volts. After 42 months of actual elapsed time at baseline consumption, the maximum charging voltage may be set to 4.15 volts. After 48 months of actual elapsed time at baseline consumption, the maximum charging voltage may be set to 4.14 volts. After 54 months of actual elapsed time at baseline consumption, the maximum charging voltage may be set to 4.12 volts. After 60 months of actual elapsed time at baseline consumption, the maximum charging voltage may be set to 4.11 volts, and so forth. After five years or another interval, the device or the battery may be recommended for replacement.

The values of the default battery maximum voltage table 410 may be determined by a manufacturer or other entity and may be implemented so as to prevent battery swelling over time. However, the actual environment of the device or battery may differ from that used for the baseline consumption. For example, the battery-specific adjustment to maximum battery voltage 420 provides environment data for a specific battery. The data indicates that the actual elapsed time, or the "real" time the battery or device has been in usage, for the battery or device is 26 months. The data indicates that the aggregate stress factor, or the stress factor determined for the 26 months of time the battery has been in usage, is 1.19, where 1.0 is a baseline. Accordingly, the adjusted elapsed time may be a product of 1.19 and 26, for a total of 30.1 months. The 30.1 month value may be used to query the default battery maximum voltage table 410 to determine that the maximum charging voltage for the battery is 4.19 volts.

In some embodiments, the device may determine predictions for subsequent time intervals. For example, for Battery 1 in FIG. 4, the predicted stress factor for a subsequent 6 month interval may be determined to be 1.10. The prediction may be determined based on historical usage data, where more recent usage data is weighted more heavily than older usage data. The predicted stress factor for the subsequent 6 month interval may be used to determine a predicted aggregate stress factor in 6 months (or another time period), where the example of FIG. 4 illustrates a predicted aggregate stress factor of 1.15 in 6 months. Accordingly, the device may determine a predicted time until a subsequent maximum charging voltage reduction is 5.3 months instead of the default 6 months in the default battery maximum voltage table 410. The 5.3 months may be 15% less than the default 6 month adjustment time provided for in the default battery maximum voltage table 410.

In an example, to predict battery stress factors, the device may determine, using historical battery environment values and corresponding respective lengths of time, a predicted battery consumption value for a second time interval. The device may determine, using the sum of the predicted battery consumption value and the historical consumption values, a reduced maximum allowed voltage that is less than a present maximum allowed voltage, and may cause the maximum allowed voltage of the battery to be reduced from the present maximum allowed voltage to about an intermediate maximum allowed voltage during the second time interval, so as to gradually reduce the drop in charging voltage. The intermediate maximum allowed voltage is less than the present maximum allowed voltage and greater than the reduced maximum allowed voltage.

With such predictions, the device may occasionally be incorrect. For example, a user may go on vacation and leave the device unused for a length of time. Accordingly, the device may reduce an amount of adjustment and/or increase maximum charging voltages to account for an inaccurate prediction. For example, the device may determine a third value indicative of a third length of time the battery was at a third voltage and a third temperature, and may determine a fourth value indicative of a fourth length of time the battery was at a fourth voltage and a fourth temperature. The device may determine that a sum of the third value and the fourth value satisfies a second threshold, and cause the maximum output voltage value to be reduced from about the second maximum output voltage value to about a third maximum output voltage value, wherein a difference between the first maximum output voltage value and the second maximum output voltage value is less than a difference between the second maximum output voltage value and the third maximum output voltage value (so as to reduce the negative adjustment). In another example, the maximum output voltage value may be increased back to a previous value if usage differs from that predicted (e.g., to an actual elapsed time value or better, etc.). Increases or decreases of maximum battery voltage may be performed linearly, exponentially (e.g., exponential curve fit, etc.), step response (e.g., threshold-based response, etc.), or another suitable method.

Figure 5:
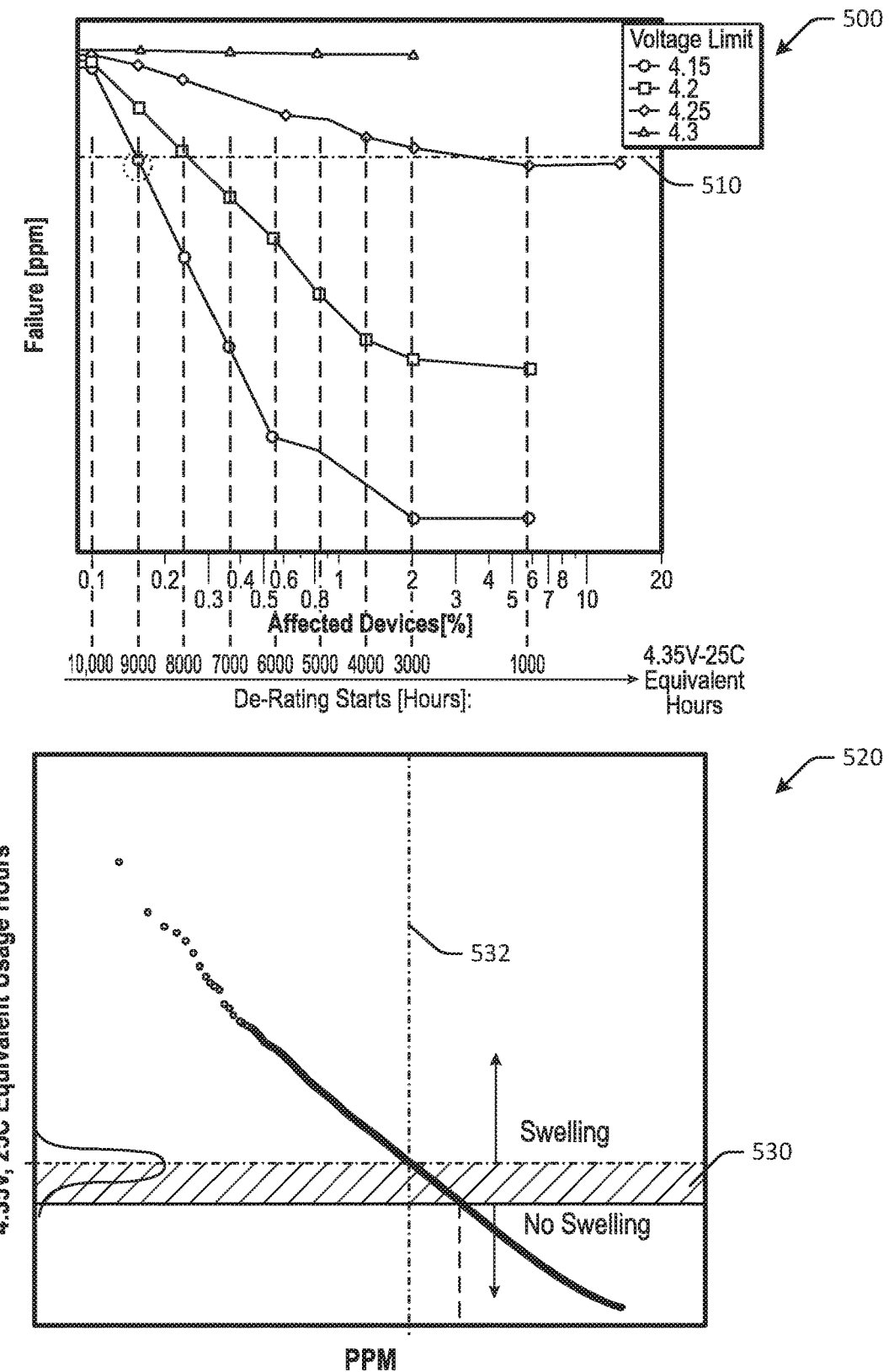
FIG. 5 are schematic drawings of battery de-rating and guard band charts in accordance with one or more embodiments of the disclosure.

FIG. 5 are schematic drawings of battery de-rating and guard band charts in accordance with one or more embodiments of the disclosure. The charts are for illustrative purposes only.

A battery de-rating chart 500 plots battery failures in parts per million units against a percentage of affected batteries, with plot lines indicating different voltage limits. As illustrated, at a charging voltage limit of 4.15 volts, with a capacity loss of 15%, the lowest number of batteries are affected. A target parts per million failure line 510 represents a target failure number. As the maximum charging voltage increases, the number of affected batteries increases, with 4.3 volts having the highest number of failures.

A guard band chart 520 depicts baseline usage at 4.35 volts and 25 degrees Celsius against a number of failures in parts per million. As illustrated, the point of failure is a distribution band 530, and not a single point, with a threshold 532, where the threshold is a target. The distribution illustrates a point after which swelling occurs, and below which swelling is avoided.

One or more operations of the methods, process flows, or use cases of FIGS. 1-5 may have been described above as being performed by a user device, or more specifically, by one or more program module(s), applications, or the like executing on a device. It should be appreciated, however, that any of the operations of the methods, process flows, or use cases of FIGS. 1-5 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-5 may be described in the context of the illustrative devices, it should be appreciated that such operations may be implemented in connection with numerous other device configurations.

The operations described and depicted in the illustrative methods, process flows, and use cases of FIGS. 1-5 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-5 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 6:
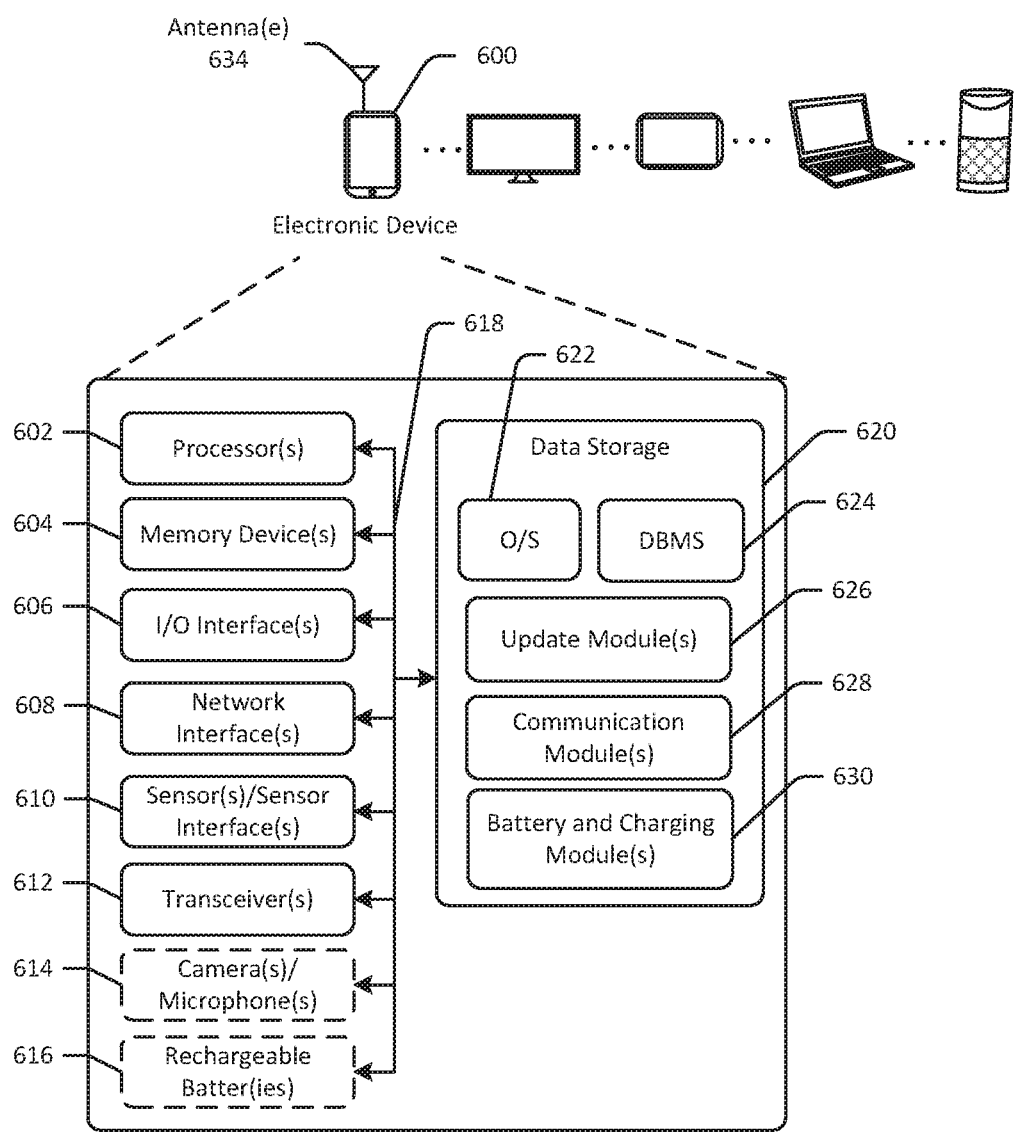
FIG. 6 schematically illustrates an example architecture of an electronic device in accordance with one or more embodiments of the disclosure.

FIG. 6 is a schematic block diagram of one or more illustrative electronic device(s) 600 in accordance with one or more example embodiments of the disclosure. The electronic device(s) 600 may include any suitable computing device including, but not limited to, a server system, a mobile device such as a smartphone, a tablet, an e-reader, a wearable device, or the like; a desktop computer; a laptop computer; a content streaming device; a set-top box; a scanning device; a barcode scanning wand; or the like. The electronic device(s) 600 may correspond to an illustrative device configuration for the device(s) of FIGS. 1-5.

The electronic device(s) 600 may be configured to communicate with one or more servers, user devices, or the like. The electronic device(s) 600 may be any suitable device, such as a mobile device, and may be configured to determine voice commands, determine wakeword utterances, determine and/or control other devices, and other operations. The electronic device(s) 600 may be configured to present content, detect sound, output digital content, and other functionality. In some embodiments, a single remote server or a single group of remote servers may be configured to perform more than one type of functionality in conjunction with an electronic device.

The electronic device(s) 600 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 600 may include one or more processors (processor(s)) 602, one or more memory devices 604 (also referred to herein as memory 604), one or more input/output (I/O) interface(s) 606, one or more network interface(s) 608, one or more sensor(s) or sensor interface(s) 610, one or more transceiver(s) 612, one or more optional camera(s) and/or microphone(s) 614, one or more optional rechargeable batteries 616, and data storage 620. The electronic device(s) 600 may further include one or more bus(es) 618 that functionally couple various components of the electronic device(s) 600. The electronic device(s) 600 may further include one or more antenna(e) 634 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 618 may include at least one of a system bus, a memory bus, an address bus, or a message bus, and may permit the exchange of information (e.g., data (including computer-executable code), signaling, etc.) between various components of the electronic device(s) 600. The bus(es) 618 may include, without limitation, a memory bus or a memory controller, a peripheral bus, an accelerated graphics port, and so forth. The bus(es) 618 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 604 of the electronic device(s) 600 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 604 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 604 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 620 may include removable storage and/or non-removable storage including, but not limited to, magnetic storage, optical disk storage, and/or tape storage. The data storage 620 may provide non-volatile storage of computer-executable instructions and other data. The memory 604 and the data storage 620, removable and/or non-removable, are examples of computer-readable storage media (CRSM) as that term is used herein.

The data storage 620 may store computer-executable code, instructions, or the like that may be loadable into the memory 604 and executable by the processor(s) 602 to cause the processor(s) 602 to perform or initiate various operations. The data storage 620 may additionally store data that may be copied to the memory 604 for use by the processor(s) 602 during the execution of the computer-executable instructions. Moreover, output data generated as a result of execution of the computer-executable instructions by the processor(s) 602 may be stored initially in the memory 604, and may ultimately be copied to the data storage 620 for non-volatile storage.

More specifically, the data storage 620 may store one or more operating systems (O/S) 622; one or more database management systems (DBMS) 624; and one or more program module(s), applications, engines, computer-executable code, scripts, or the like such as, for example, one or more update module(s) 626, one or more communication module (s) 628, and/or one or more battery and charging module(s) 630. Some or all of these module(s) may be sub-module(s). Any of the components depicted as being stored in the data storage 620 may include any combination of software, firmware, and/or hardware. The software and/or firmware may include computer-executable code, instructions, or the like that may be loaded into the memory 604 for execution by one or more of the processor(s) 602. Any of the components depicted as being stored in the data storage 620 may support functionality described in reference to corresponding components named earlier in this disclosure.

The data storage 620 may further store various types of data utilized by the components of the electronic device(s) 600. Any data stored in the data storage 620 may be loaded into the memory 604 for use by the processor(s) 602 in executing computer-executable code. In addition, any data depicted as being stored in the data storage 620 may potentially be stored in one or more datastore(s) and may be accessed via the DBMS 624 and loaded in the memory 604 for use by the processor(s) 602 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 6, an example datastore(s) may include, for example, historical data for previously identified products, purchase or order history, user profile information, and/or other information.

The processor(s) 602 may be configured to access the memory 604 and execute the computer-executable instructions loaded therein. For example, the processor(s) 602 may be configured to execute the computer-executable instructions of the various program module(s), applications, engines, or the like of the electronic device(s) 600 to cause or facilitate various operations to be performed in accordance with one or more embodiments of the disclosure. The processor(s) 602 may include any suitable processing unit capable of accepting data as input, processing the input data in accordance with stored computer-executable instructions, and generating output data. The processor(s) 602 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 602 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 602 may be capable of supporting any of a variety of instruction sets.

Referring now to functionality supported by the various program module(s) depicted in FIG. 6, the update module(s) 626 may include computer-executable instructions, code, or the like that responsive to execution by one or more of the processor(s) 602 may perform functions including, but not limited to, requesting and/or receiving software updates, such as over-the-air updates, requesting battery voltage data, storing data, modifying maximum battery charge values at integrated circuits, such as at a Power Management Integrated Circuit, and the like.

The communication module(s) 628 may include computer-executable instructions, code, or the like that responsive to execution by one or more of the processor(s) 602 may perform functions including, but not limited to, sending and/or receiving data, including content, sending and/or receiving instructions and commands, and the like.

The battery and charging module(s) 630 may include computer-executable instructions, code, or the like that responsive to execution by one or more of the processor(s) 602 may perform functions including, but not limited to, determining a charging voltage, calculating elapsed time, calculating battery environment values, calculating acceleration or stress factors, calculating deceleration factors, adjusting charging voltages, determining predicted usage, determining voltage and/or temperature data, and the like.

Referring now to other illustrative components depicted as being stored in the data storage 620, the O/S 622 may be loaded from the data storage 620 into the memory 604 and may provide an interface between other application software executing on the electronic device(s) 600 and the hardware resources of the electronic device(s) 600. More specifically, the O/S 622 may include a set of computer-executable instructions for managing the hardware resources of the electronic device(s) 600 and for providing common services to other application programs (e.g., managing memory allocation among various application programs). In certain example embodiments, the O/S 622 may control execution of the other program module(s). The O/S 622 may include any operating system now known or which may be developed in the future including, but not limited to, any server operating system, any mainframe operating system, or any other proprietary or non-proprietary operating system.

The DBMS 624 may be loaded into the memory 604 and may support functionality for accessing, retrieving, storing, and/or manipulating data stored in the memory 604 and/or data stored in the data storage 620. The DBMS 624 may use any of a variety of database models (e.g., relational model, object model, etc.) and may support any of a variety of query languages. The DBMS 624 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 600 is a mobile device, the DBMS 624 may be any suitable lightweight DBMS optimized for performance on a mobile device.

Referring now to other illustrative components of the electronic device(s) 600, the input/output (I/O) interface(s) 606 may facilitate the receipt of input information by the electronic device(s) 600 from one or more I/O devices as well as the output of information from the electronic device (s) 600 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 600 or may be separate. The I/O devices may further include, for example, any number of peripheral devices such as data storage devices, printing devices, and so forth.

The I/O interface(s) 606 may also include an interface for an external peripheral device connection such as universal serial bus (USB), FireWire, Thunderbolt, Ethernet port or other connection protocol that may connect to one or more networks. The I/O interface(s) 606 may also include a connection to one or more of the antenna(e) 634 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 600 may further include one or more network interface(s) 608 via which the electronic device(s) 600 may communicate with any of a variety of other systems, platforms, networks, devices, and so forth. The network interface(s) 608 may enable communication, for example, with one or more wireless routers, one or more host servers, one or more web servers, and the like via one or more networks.

The antenna(e) 634 may include any suitable type of antenna depending, for example, on the communications protocols used to transmit or receive signals via the antenna (e) 634. Non-limiting examples of suitable antennae may include directional antennae, non-directional antennae, dipole antennae, folded dipole antennae, patch antennae, multiple-input multiple-output (MIMO) antennae, or the like. The antenna(e) 634 may be communicatively coupled to one or more transceivers 612 or radio components to which or from which signals may be transmitted or received.

As previously described, the antenna(e) 634 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 634 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 634 may be configured to transmit or receive radio frequency signals within any suitable frequency range forming part of the unlicensed portion of the radio spectrum.

The antenna(e) 634 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 612 may include any suitable radio component(s) for—in cooperation with the antenna(e) 634—transmitting or receiving radio frequency (RF) signals in the bandwidth and/or channels corresponding to the communications protocols utilized by the electronic device(s) 600 to communicate with other devices. The transceiver(s) 612 may include hardware, software, and/or firmware for modulating, transmitting, or receiving—potentially in cooperation with any of antenna(e) 634—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 612 may further include hardware, firmware, or software for receiving GNSS signals. The transceiver(s) 612 may include any known receiver and baseband suitable for communicating via the communications protocols utilized by the electronic device(s) 600. The transceiver(s) 612 may further include a low noise amplifier (LNA), additional signal amplifiers, an analog-to-digital (A/D) converter, one or more buffers, a digital baseband, or the like.

The sensor(s)/sensor interface(s) 610 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The camera(s) 614 may be any device configured to capture ambient light or images. The microphone(s) 614 may be any device configured to receive analog sound input or voice data. The rechargeable batter(ies) 616 may be any suitable power storage device, such as a lithium ion battery and may be in various form factors, such as pouch form factors, cylindrical form factors, and the like.

It should be appreciated that the program module(s), applications, computer-executable instructions, code, or the like depicted in FIG. 6 as being stored in the data storage 620 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 600, and/or hosted on other computing device(s) accessible via one or more networks, may be provided to support functionality provided by the program module(s), applications, or computer-executable code depicted in FIG. 6 and/or additional or alternate functionality. Further, functionality may be modularized differently such that processing described as being supported collectively by the collection of program module(s) depicted in FIG. 6 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 6 may be implemented, at least partially, in hardware and/or firmware across any number of devices.

It should further be appreciated that the electronic device(s) 600 may include alternate and/or additional hardware, software, or firmware components beyond those described or depicted without departing from the scope of the disclosure. More particularly, it should be appreciated that software, firmware, or hardware components depicted as forming part of the electronic device(s) 600 are merely illustrative and that some components may not be present or additional components may be provided in various embodiments. While various illustrative program module(s) have been depicted and described as software module(s) stored in the data storage 620, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-5 may be performed by a device having the illustrative configuration depicted in FIG. 6, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-5 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-5 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A device comprising:
   a battery having an associated first maximum output voltage value;
   memory configured to store computer-executable instructions; and
   at least one computer processor configured to access the memory and execute the computer-executable instructions to:
   determine a first value indicative of a first length of time during which the battery outputted a first average voltage and was at a first average temperature;
   determine a second value indicative of a second length of time during which the battery outputted a second average voltage and was at a second average temperature;
   determine that a first sum of the first value and the second value is equal to or greater than a first threshold value;
   change the first maximum output voltage value to a second maximum output voltage value that is lower than the first maximum output voltage value;
   determine, based at least in part on the first length of time, a third value indicative of a third length of time during which an average voltage output of the battery will be substantially the first average voltage and an average temperature of the battery will be substantially the first average temperature;
   determine that a second sum of the first value, the second value, and the third value satisfies a second threshold; and
   determine a third maximum voltage value for the battery that is lower than the second maximum voltage value.

2. The device of claim 1, wherein the at least one processor is further configured to access the memory and execute the computer-executable instructions to:
   determine that an actual elapsed time value is less than the third length of time; and
   cause the maximum output voltage to be increased from about the third maximum output voltage value to about the second maximum output voltage value.

3. The device of claim 1, wherein the at least one processor is further configured to access the memory and execute the computer-executable instructions to:
   determine a first weight for the first value based at least in part on an elapsed time since the expiration of the first length of time;
   determine, using the first weight and the first value, a first weighted value;
   determine a second weight for the second value based at least in part on an elapsed time since the second length of time;
   determine, using the second weight and the second value, a second weighted value; and
   determine that a second sum of the first weighted value and the second weighted value satisfies the first threshold.

4. The device of claim 1, wherein the at least one processor is further configured to access the memory and execute the computer-executable instructions to:
   determine that a charger state has changed from a first state to a second state;
   wherein the first length of time and the second length of time occurred while the charger state was the first state.

5. The device of claim 1, wherein the at least one processor is further configured to access the memory and execute the computer-executable instructions to:
   determine a fourth value indicative of a fourth length of time the battery was at a third voltage and a third temperature;
   determine a fifth value indicative of a fifth length of time the battery was at a fourth voltage and a fourth temperature;
   determine that a second sum of the fourth value and the fifth value satisfies a second threshold; and
   cause the maximum output voltage value to be reduced from about the third maximum output voltage value to about a fourth maximum output voltage value, wherein a difference between the first maximum output voltage value and the second maximum output voltage value is less than a difference between the second maximum output voltage value and the third maximum output voltage value.

6. The device of claim 1, wherein the at least one processor is further configured to access the memory and execute the computer-executable instructions to:
   determine a stress factor for the first length of time;
   determine an actual elapsed time during the first length of time; and
   determine a product of the stress factor and the actual elapsed time, wherein the first value is the product.

7. The device of claim 6, wherein the at least one processor is further configured to access the memory and execute the computer-executable instructions to:
   determine a first difference between the first voltage and a target voltage; and
   determine a second difference between the first temperature and a target temperature;
   wherein the at least one processor is configured to determine the stress factor for the length of time using the first difference and the second difference.

8. A method comprising:
   determining, by a device comprising a battery, a first value indicative of a first length of time during which the battery outputted a first voltage and was at a first temperature, wherein the first voltage is an average voltage during the first length of time and the first temperature is an average temperature during the first length of time;
   determining a second value indicative of a second length of time during which the battery outputted a second voltage and was at a second temperature, wherein the second voltage is an average voltage during the second length of time and the second temperature is an average temperature during the second length of time;
   determining that a first sum of the first value and the second value is equal to or greater than a first threshold value; and
   changing the first maximum output voltage value to a second maximum output voltage value that is lower than the first maximum output voltage value.

9. The method of claim 8, further comprising:
   determining, based at least in part on the first length of time, a third value indicative of a third length of time during which the average voltage output of the battery will be substantially the first voltage and the average temperature of the battery will be substantially the first temperature;

determining that a second sum of the first value, the second value, and the third value satisfies a second threshold; and causing a maximum output voltage value of the battery to be at around a third maximum voltage value that is lower than the second maximum voltage value.

10. The method of claim 9, further comprising:

determining that an actual elapsed time value is less than the third length of time; and causing the maximum output voltage to be increased from about the third maximum output voltage value to about the second maximum output voltage value.

11. The method of claim 8, further comprising:

causing the maximum output voltage value to be reduced from the second maximum output voltage value to about a third maximum output voltage value.

12. The method of claim 8, further comprising:

determining a first weight for the first value based at least in part on an elapsed time since the expiration of the first length of time;

determining, using the first weight and the first value, a first weighted value;

determining a second weight for the second value based at least in part on an elapsed time since the second length of time;

determining, using the second weight and the second value, a second weighted value; and determining that a second sum of the first weighted value and the second weighted value satisfies the first threshold.

13. The method of claim 8, further comprising:

determining that a charger state has changed from a first state to a second state;

wherein the first length of time and the second length of time occurred while the charger state was the first state.

14. The method of claim 8, further comprising:

determining a third value indicative of a third length of time the battery was at a third voltage and a third temperature;

determining a fourth value indicative of a fourth length of time the battery was at a fourth voltage and a fourth temperature;

determining that a second sum of the third value and the fourth value satisfies a second threshold; and causing the maximum output voltage value to be reduced from about the second maximum output voltage value to about a third maximum output voltage value, wherein a difference between the first maximum output voltage value and the second maximum output voltage value is less than a difference between the second maximum output voltage value and the third maximum output voltage value.

15. The method of claim 8, further comprising:

determining a stress factor for the first length of time;

determining an actual elapsed time during the first length of time; and determining a product of the stress factor and the actual elapsed time, wherein the first value is the product.

16. The method of claim 8, further comprising:

determining a first difference between the first voltage and a target voltage; and determining a second difference between the first temperature and a target temperature;

wherein the stress factor for the length of time is determined using the first difference and the second difference.

17. A device comprising:

a battery having an associated first maximum output voltage value;

memory configured to store computer-executable instructions; and at least one computer processor configured to access the memory and execute the computer-executable instructions to:

determine a first value indicative of a first length of time during which the battery outputted a first average voltage and was at a first average temperature;

determine a second value indicative of a second length of time during which the battery outputted a second average voltage and was at a second average temperature;

determine, based at least in part on the first length of time, a third value indicative of a third length of time during which an average voltage output of the battery will be substantially the first average voltage and an average temperature of the battery will be substantially the first average temperature;

determine that a second sum of the first value, the second value, and the third value satisfies a second threshold; and determine a third maximum voltage value that is lower than the second maximum voltage value.

18. The device of claim 17, wherein the at least one processor is further configured to access the memory and execute the computer-executable instructions to:

determine that a first sum of the first value and the second value is equal to or greater than a first threshold value; and change the first maximum output voltage value to a second maximum output voltage value that is lower than the first maximum output voltage value.

19. The device of claim 17, wherein the at least one processor is further configured to access the memory and execute the computer-executable instructions to:

determine that an actual elapsed time value is less than the third length of time; and cause the maximum output voltage to be increased from about the third maximum output voltage value to about the second maximum output voltage value.

* * * * *